United States Patent [19]

Tihanyi et al.

[11] 4,101,922

[45] Jul. 18, 1978

[54] FIELD EFFECT TRANSISTOR WITH A SHORT CHANNEL LENGTH

[75] Inventors: Jenoe Tihanyi, Munich; Voachim Hoepfner, Planegg, both of Germany

[73] Assignee: Siemens Aktiengesellschaft, Berlin & Munich, Germany

[21] Appl. No.: 775,978

[22] Filed: Mar. 9, 1977

[30] Foreign Application Priority Data

Mar. 17, 1976 [DE] Fed. Rep. of Germany ....... 2611338

[51] Int. Cl.² ........................................... H01L 29/78
[52] U.S. Cl. ........................................ 357/23; 357/22
[58] Field of Search ................................... 357/23, 22

[56] References Cited

U.S. PATENT DOCUMENTS

| | | | |
|---|---|---|---|
| 3,982,263 | 9/1976 | Dobkin | 357/23 |
| 4,007,478 | 2/1977 | Yagi | 357/23 |

*Primary Examiner*—Edward J. Wojciechowicz
*Attorney, Agent, or Firm*—Hill, Gross, Simpson, Van Santen, Steadman, Chiara & Simpson

[57] ABSTRACT

A field effect transistor with a MIS gate arrangement having a source and drain formed in a semiconductor body and including an electrically conductive region additionally provided which lies beneath the source zone and which has a conductivity opposite to and/or electrical conductivity which is higher than the semiconductor body which surrounds the zone and in which in the controllable field effect gate the electrically conductive zone is spaced a distance from the gate and the boundary surface and wherein the gate insulation layer projects laterally a space relative to the source zone which is approximately 1 to 10 times the thickness of the gate insulation layer and the distance from the gate arrangement to the boundary surface is 1 to 5 times the thickness.

10 Claims, 6 Drawing Figures

FIELD EFFECT TRANSISTOR WITH A SHORT CHANNEL LENGTH

BACKGROUND OF THE INVENTION

1. Field of the Invention

This invention relates in general to field effect transistors and in particular to a novel field effect transistor.

2. Description of the Prior Art

Field effect transistors with MIS gate arrangements are well known wherein the source and drain regions are spaced a distance apart in the semiconductor body and lateral arrangements next to each other are on a selected surface of a semiconductor body are the preferred arrangement.

So as to achieve a switching speed as fast as possible with field effect transistors of this type, it is conventional to provide channel lengths between the source and drain regions which are short relative to the current path. One method of achieving this has been called the double diffusion process and is described in the publication "Solid State Electronics" published by the Pergamon Press 1968, Vol. 11, page 411–418. In this process, in a first step, diffusion doping is carried out with a doping material which produces a first conductivity type in a semiconductor body. The diffusion is carried out from the exterior through a mask opening into the semiconductor body where the doping material in the semiconductor body also diffuses laterally beyond the boundary of the mask opening. In a second diffusion step, material which produces an opposite conductivity type is diffused through the same mask opening and in this second process step, the lateral diffusion beyond the mask edge in the finished item is less than was achieved for the doping material during the first process step. Charge carriers which drift laterally out of the diffusion zone of the second process step region towards a drain region pass through a short channel zone in which the doping of the opposite conductivity type exists as a result of the first diffusion step.

So-called buried layers and buffer layers are also known from the prior art. These are referred to as buried layers and buffer layers as described, for example, in "Electronics", Vol. 42 1969, pages 74–80. Such layers are used in bipolar transistors to electrically screen regions of a semiconductor body close to the surface from the underlying regions. In a screened region of this type lying close to the surface, a bipolar semiconductor component such as a bipolar transistor is provided. The buried layers extend completely across the entire region occupied by the semiconductor component and this buried layer does not provide a function which directly interacts with the function of the semiconductor component.

Another field effect transistor of the prior art which has a short channel length, is the so-called VMOS transistor such as described in "Electronic Design", Vol. 21, 1975, page No. 304.

German AS No. 2,415,408 describes a semiconductor body in which a layer is arranged and which is somewhat comparable with a buried layer. The applicants of the present invention are the inventors of German AS No. 2,415,408 and this application provides a field effect transistor arrangement with a layer which extends across the entire surface or the entire region of the transistor and which correspondingly across the entire field effect transistor beneath the gate provides a PN junction which has a space charge region which screens the entire overlying field effect transistor from underlying regions both electrically and functionally.

SUMMARY OF THE INVENTION

The present invention provides a MIS field effect transistor which has a short channel length and, thus, the electrical advantages which are derived with short channel lengths and particularly utilizes a small space which is an advantage especially for integrated circuit techniques. A further object of the invention is to provide an inexpensive process for production of field effect transistors.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
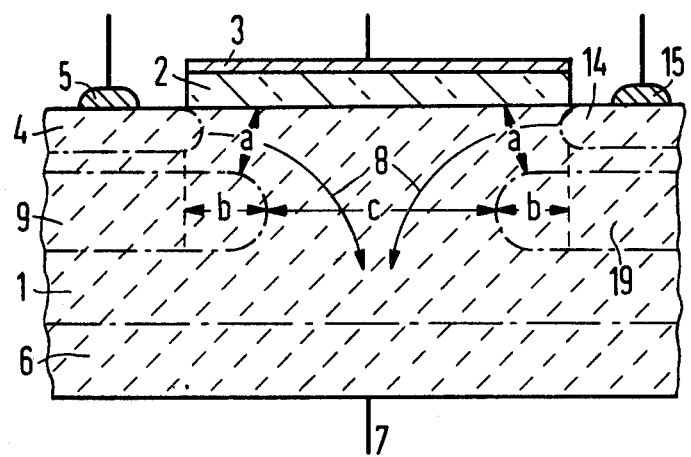
FIG. 1 is a cross-sectional view through a substrate incorporating the transistor of the invention.

FIG. 1 is a sectional view through a substrate in which lines representing the edges behind the cross-sectional plane have been omitted from the drawing for purposes of clarity. Thus, the drawing illustrates either a rotational symmetrical arrangement or a strip shaped arrangement. The particular geometrical shape selected depends upon the other components which the field effect transistor is to be integrated with and in particular the shape of such for the components.

The semiconductor body 1 is relatively high ohmic and is only weakly doped of N— or P— and in the exemplary embodiment which is to be described, it will be assumed that the semiconductor body 1 has N— conductivity. The semiconductor body 1 may consist of silicon, for example, and a known gate insulation layer 2 which, for example, may be silicon dioxide or silicon nitride is formed on one surface of the body 1. The gate electrode 3 overlies the insulating layer 2 and may be formed as a vapor deposited aluminum layer or as a layer of polysilicon material. Doped zones 4 and 14 located inside the semiconductor body 1 beneath its surfaces and which are doped N+ are arranged on opposite sides of the gate 3 in the semiconductor body 1. If the field effect transistor is constructed in a rotational form, the regions 4 and 14 constitute a single ring shaped zone and where the arrangement is made in the form of strip-shaped the two strips 4 and 14 would be electrically connected to each other. Electrical contact terminals 5 and 15 are galvanically connected to the regions 4 and 14 as shown. For a rotation symmetrical arrangement, the contact terminals 5 and 15 can be formed as a cohesive electrode coating. A region 6 on the surface opposite to the surface on which the insulating layer 2 is formed is doped N+ and a metallic contact terminal 7 is attached thereto as shown.

The structure thus described can be utilized as a field effect transistor in which the N+ regions 4 and 14 are the source region and the N+ region 6 constitutes the drain region and with a N− conducting semiconductor body 1 a normally on field effect transistor or a field effect transistor of the depletion type is provided with the N−doping over $5.10^{15} cm^{-3}$.

With the MIS gate arrangement comprising the insulating layer 2 and the gate electrode 3, when an electrical voltage is connected between the gate electrode 3 and the contact terminals 5 and 15, in other words, the source zone, it is possible to achieve a voltage dependent control of the charge carrier current between the source zones 4 and 14 and the drain zone 6 as a result of the field influence. A charge carrier current of this type is indicated by arrows 8 in FIG. 1.

As a practical matter, the control and utilization of a transistor such as shown in FIG. 1 requires buried zones indicated by 9 and 19. The zones 9 and 19 may consist of a cohesive zone in the case of rotational symmetry and for a strip-shaped arrangement the zones 9 and 19 are correspondingly strip-shaped and are connected together. The regions 9 and 19 are doped to an opposite conductivity type relative to the regions 4 and 14. In an embodiment constructed according to the invention, the regions 9 and 19 are of opposite conductivity type relative to the semiconductor body 1 and are highly doped relative to the degree of doping of the semiconductor body 1. However, the invention can also be realized with regions 9 and 19 which possess the same conductivity type as the surrounding semiconductor material of the semiconductor body 1 in which case, however, it is necessary that the zones 9 and 19 possess a higher doping concentration than that of the semiconductor body 1. For example, in a weakly N− conducting semiconductor body 1, an embodiment of the invention has P+ doped source regions 4 and 14 and P+ doped drain region 6 and N+ doped zones 9 and 19. For the various embodiments of the invention, it is necessary that the conductivity type of the regions 9 and 19 possess the conductivity which is opposite to that of the source regions 4, 14 so that a PN junction always exist between the regions 9 and 19 and the source regions 4 and 14. In the region of the field effect from the gate electrode, the regions 9 and 19 are always spaced a distance "a" from the surface of the semiconductor body 1 as shown. It should be realized, of course, that the dash dot lines in FIG. 1 which show the limits of the regions 4 and 14 and regions 9 and 19 are only approximate boundaries.

Particularly when the regions 9 and 19 have the same conductivity type as the semiconductor body 1, the doping of the regions 9 and 19 will be higher than that of the body 1, so that when potentials and potential differences which arise during operation relative to the gate will prevent the majority charge carriers of the regions 9 and 19 to be discharged, in other words, they will not be forced out of the regions 9 and 19 as a result of the field effects. When the regions 9 and 19 possess the opposite conductivity type to the semiconductor body 1 so as to allow electrical connection to the semiconductor body, the regions 9 and 19 extend outwardly to the surface and they will be electrically connected to the source region 4, 14.

When the regions 9, 19 are provided in the ring shaped form it is possible to achieve a constriction of the charge carrier drift path as shown by the arrows 8 between the source 4, 14 and the drain 6. This substantially increases the sensitivity of the control arising from the gate potential applied to the gate electrode 3 according to the field effect transistor of the invention. In the invention the dimension "a" which is the distance from the surface of the substrate body 1 to the regions 9, 19 as well as the distances "b" which are the distances that the regions 9 and 19 extend laterally under the gate region 2 as well as the dimension "c" which is the distance between the extremes of the regions 9 and 19 are significant.

As in all field effect transistors, the source regions 4, 14 of the field effect transistor of the invention, extend beneath the outer edges of the gate electrode 3 so that relative to a charge carrier drift path 8 between the source and drain a field influence of the charge carrier current by the gate potential especially for the normally off type will be achieved directly from the edges of the source zone 4, 14 which inject charge carriers into the semiconductor body. To ensure efficient operation and control of the field effect transistor by the gate potential it is provided in accordance with the invention that the regions 9, 19 in each case extend relative to the source region 4, 14 into the channel zone by an amount "b" as illustrated in FIG. 1. Thus, in the embodiment of FIG. 1, a constriction of the charge carrier drift path 8 exists and the drift path is referenced as "c". The constriction of the charge carrier drift path as illustrated constitutes an essential feature of the invention and according to the invention the "b" dimension should equal approximately 0.5 to 5 times the dimension "a". The distance "a" is approximately in the order of the thickness "d" of the insulation layer 2 so that "a" is approximately equal to 1 to 5 times "d". The dimension "d" is approximately 1 to 10 times the thickness of "d". As a secondary condition, $b:a$ = approximately 1:1 to 10:1.

In a particular embodiment constructed according to the invention, the following dimensions were utilized. The semiconductor body consisted of silicon which was doped with doping which intrinsically extends to approximately $10^{15} cm^{-3}$. The doping of the N−conducting source zones 4, 14 was between $10^{18} cm^{-3}$ and $10^{20} cm^{-3}$. Doping of this type may be preferably produced by implantation of phosphorous atoms with a dose of 1 to $10.10^{15} cm^{-3}$ with 50 to 100 keV relative to the semiconductor body 1 composed of silicon. The thickness of the source region 4, 14 is preferably in the order of 0.01 μm and the average distance of this region from the surface of the semiconductor body amounts to 0.05 to 0.1 μm. Boron is particularly suitable for the region 9, 19 which has a P-doping thus producing opposite conductivity type relative to the source region 4, 14. The regions 9, 19 have a dose of 3 to $10.10^{12} cm^{-3}$ with an ion energy of 50 to 200 keV. This produces in the semiconductor body 1 a region 9, 19 which has an average distance of 0.1 to 0.5 μm from the surface of the semiconductor body 1 with a thickness of approximately 0.05 to 0.1 μm.

Dopings of this type by ion implantation are accomplished so as to obtain real and spatial limitations of the implantation zones being formed by using masks and it is desirable to use a mask with a layer which is applied to the semiconductor body 1 and which screens the semiconductor body from the implantation. The covering layer is provided with implantation windows through which the implantation takes place. In the embodiment illustrated in FIG. 1, the gate insulation layer 2 of silicon dioxide has a thickness of 0.02 to 0.1 μm can be used as a mask for example, and the left and right hand edges of the layer 2 act as lateral implantation boundaries for the region 4, 14 as well as the regions 9,19. Since the regions 9, 19 are a greater depth than the regions 4, 14 the lateral expansion under the layer 2 will extend further under the layer 2 as shown in FIG. 1 and by the distance "b". This is discussed in "Japanese Journal of Applied Physics", Vol. 11, page 134, 1972, and thus the greater lateral extension of the region 9, 19 than region 4, 14 is accomplished in a simple manner merely due to the increased depth of the layers 9, 19. The dimension "b" may be in the order of 0.02 to 0.1 μm and the thickness of the region 9, 19 may be between 0.1 to 0.1 μm.

The dimension "c" which determines the region for charge current carriers could be in the range of 1 to 5 μm.

The dopings of the regions 9, 19 relative to that of the semiconductor body 1 is sufficiently high to ensure that when electrical voltages in the order of 20 to 60 volts maximum occur between drain electrode 6, and the regions 9, 19 and the source regions 4, 14 that a depletion of the carriers occurs in the regions 9, 19 and particularly in the spatial edge zone which is designated by dimension "b". Even at the maximum quoted electrical voltages this edge zone possesses an electrical conductivity which is still considerably higher than its surrounding vicinity and the PN junction to the source regions 4, 14 is also maintained.

The projecting edge "b" in the invention is selected to be such that at the maximum provided gate voltage between the gate 3 and the source 4, 14 an effective constriction of the charge carrier drift path 8 in other words, of the actual channel of the field effect transistor is achieved.

A field effect transistor according to the invention illustrated in FIG. 1 may be operated with the following electrical voltages. Voltage between the source and drain up to 100 volts and voltages between the gate and source up to 20 volts.

Figure 2:
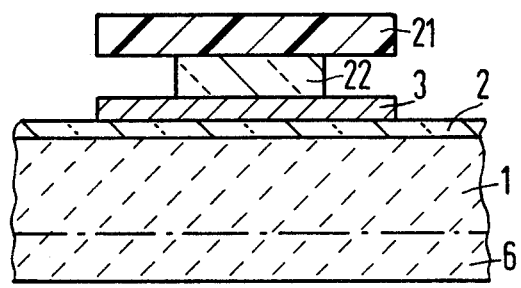
FIG. 2 illustrates a sectional view of the invention during construction.

FIG. 2 illustrates the technology of producing a field effect transistor according to the invention as illustrated in FIG. 1. A weakly N-conductive doped silicon layer 1 is applied preferably epitaxially to a semiconductor substrate body consisting of N+ silicon and the N+ silicon region forms the drain zone 6. On a surface of the silicon body 1, the gate insulation layer 2 is produced by a vapor deposition or by thermal oxidation, then an polycrystalline silicon electrode layer 3 is applied over the layer 2. On the layer 3, pyrolitically deposited silicon dioxide layer 22 is applied and then following a photolithographic process using a photo-lacquer layer 21 the silicon dioxide layer is etched by wet chemistry to form a structure 22 shown in FIG. 2 having lateral mask boundaries. FIG. 2 illustrates an intermediate stage of a production process which is to be described. The pyrolitic silicon dioxide layer 22 has a thickness of approximately 0.5 μm and the aluminum layer has a thickness of approximately 0.1 μm and the gate insulation layer 2 has a thickness of 0.06 μm. Using the photo-lacquer layer 21 and its structure 22 as a mask, the layer 3 is removed by ion beam etching except for that portion which is desired as the gate electrode 3 producing the structure illustrated in FIG. 2 for this layer 3.

Figure 3:
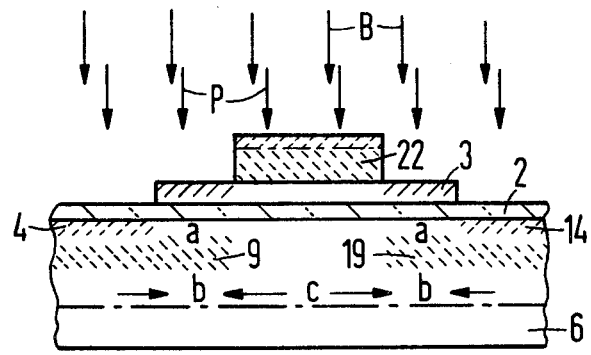
FIG. 3 is a sectional view illustrating a process step for producing the invention.

FIG. 3 illustrates the process steps of the ion implantation with phosphorous and boron. In FIG. 3, is illustrated the manner in which the layer 3 and the pyrolitically produced silicon layer 2 exert a masking effect. The shading toward the upper surface and at the edges to the right and left of FIG. 3 indicate the implantation zones which include the zones 4, 14. The regions further in the substrate and which extend further under the electrode 3 toward each other include the regions 9, 19 for the implanation zones for the boron implanation B. In this illustrated production process, the edge "b" which projects outwardly as an essential feature of the invention can be produced even without a lateral widening of the implantation zone since in particular with the above mentioned implanation conditions on account of the small thickness of the layer 3, it has no decisive screening effect for the boron implantation which extends to a considerably greater depth than the phosphorous implanation. It will be observed from FIG. 3 that this produces a structure which is identical to that illustrated in FIG. 1 for the field effect transistor. For completing the invention, it is merely necessary to remove the pyrolitic silicon dioxide layer 22. The other measures for final completion such as the application of contacts to the individual semiconductor regions can be accomplished in a conventional manner.

Figure 4:
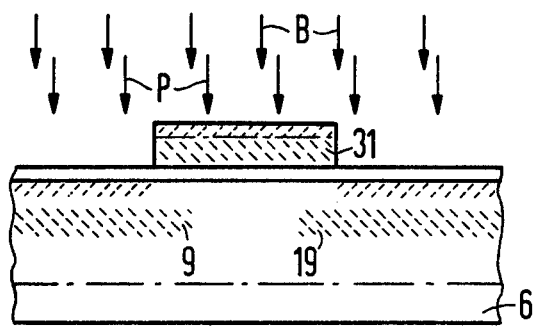
FIG. 4 illustrates a process step for producing the invention according to a modification.

FIG. 4 discloses a further preferred production process in which common numerals used in FIG. 4 with those of FIGS. 1 and 3 correspond to similar regions. An auxiliary layer of aluminum 31 is produced from initially continuous layer of aluminum bilateral delimitation and masking as, for example, by etching. Using implantation as described above with phosphorous and boron, the implantation zones shown in shading in FIG. 4 and similar to those shown in FIG. 3 can be produced as a result of the covering effect of the aluminum auxiliary layer 31. In this process, the lateral widening of the deeper implantation zone 9, 19 extend inwardly from the edges of the layer 31 by distance of "b". The horizontal width dimension of the aluminum auxiliary layer 31 shown in FIG. 4 is selected to be such that the end result is a nonimplanted zone having the dimension "c" as shown in FIG. 1. Upon the completion of the implantation, the auxiliary layer 31 is removed and replaced by the gate electrode 3 illustrated in FIG. 1 and the terminals 5, 15 and 7 are applied in a known manner as well as the terminal to the gate electrode 3.

It is desirable that a tempering process at approximately 900° C is provided after the completion of the implantation processes so as to activate the implantation materials.

A transistor according to the invention can be produced with a width of 2 μm without difficulty for the gate electrode 3. In the integrated circuit technique, it is possible to reduce the distance between adjacent gate electrodes of a different adjacent transistors to 4 μm. It is thus possible to achieve a high packing density of 25 μm² per transistor.

Figure 5:
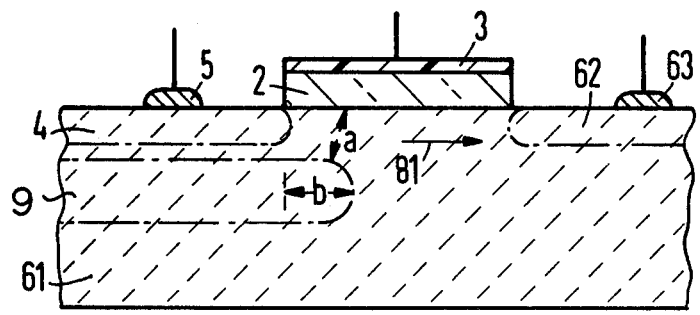
FIG. 5 is a sectional view in which the source and drain electrodes are located on the same semiconductor surface.

FIG. 5 is a schematic view of an embodiment according to the invention of a field effect transistor in which the drain region 62 is arranged on the same surface of the semiconductor body 61 as the source 4. This embodiment is of particular interest for application in which it is important that the source and drain regions and the source and drain terminals should be accessible from a single side. The charge carrier drift path in FIG. 5 which compares to the drift path 8 in FIG. 1 is indicated by the arrow 81. It is to be noted that the region 9 extends a dimension "b" under the gate 3 adjacent the source region 4. The dimension "a" is also indicated in FIG. 5 and "a" should be equal approximately to 1 to 5 times the thickness d of the insulation layer 2 and b should be approximately 1 to 10 times the thickness d of the insulation layer 2 and the ratio of b:a should be approximately equal to 1:1 to 10:1.

The process for producing the transistor shown in FIG. 5 is substantially the same as the production processes for the producing the other embodiments described above.

Figure 6:
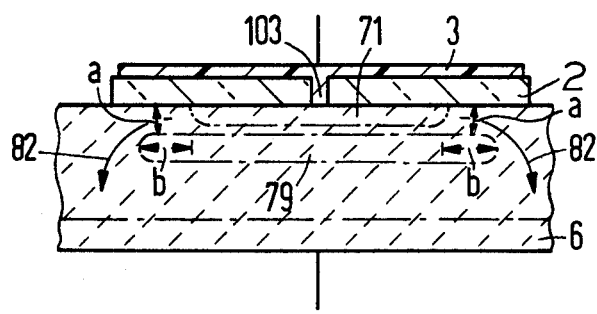
FIG. 6 is a sectional view illustrating a modification of the invention.

FIG. 6 is a modification of the invention illustrated in FIG. 1. This embodiment is particularly desirable for electronic circuits in which the gate electrode and the source region of the field effect transistor are electrically connected to each other. Such electronic circuits occur, for example, in inverters and in flipflop circuits in which a field effect transistor is used as the load resistor.

Those portions of the embodiment of FIG. 6 which are identical to those in FIG. 1 are identified with the same numerals. The source zone 71 compares to the source zone 4, 14 of FIG. 1. The source zone 71 can, for example, be disc shape. However, a strip shape for the source region 71 can also be used. A buried region 79 is comparable to the regions 9, 19 in FIG. 1. Also, in this embodiment, the edges which form an essential feature of the invention and which are designated by "b" comprise the ends of zone 79 which extend beyond the ends of the source region 71. These projecting edges "b" are spaced a distance "a" from the surface of the semiconductor body 1 which distance again conforms according to the invention with the distance "a" of the embodiment illustrated in FIG. 1. The drift path 82 of the charge carriers between the source zone 81 and the drain zone 6 is indicated by the arrows 82.

Also, in the embodiment illustrated in FIG. 6, the short channel can be achieved by means of the invention by selecting the dimensions "a" and "b", as explained in detail relative to the other embodiments. For this purpose, the gate electrode 3 projects laterally beyond the edge of the source region 71 so that the control also actually occurs in that area marked with the arrows "a" in FIG. 6. An electrical contact 103 exists between the gate electrode 3 and the source zone 71. At a suitable point of the semiconductor body, the zone 79 is generally lead to the surface of the body so as to electrically or electronically connect zone 79 which is of significance, for example, when the transistor is used as a load resistor. In the embodiment of FIG. 6, it is to be noted that the zone 79 extends a distance "b" at either end beyond the zone 71.

Although the invention has been described with respect to preferred embodiments, it is not to be so limited as changes and modifications may be made which are within the full intended scope as defined by the appended claims.

We claim as our invention:

1. A field effect transistor with a MIS gate arrangement and with a source and drain regions in a semiconductor body, an electrically conductive zone additionally provided which lies in said semiconductor body beneath the source zone and which is of a conductivity type opposite to a portion of the semiconductor body surrounding it, wherein in the region of the controllable field effect by said gate arrangement (2) said additional zone (9) is spaced a distance (a) from said gate arrangement and from the boundary surface between the semiconductor body (1) and the gate insulation layer (2), and is bounded by an edge which forms a channel having a width "c" in said zone (9) and which projects laterally by a distance (b) beyond the edge of the source zone (4) into the path of charge carriers and where the distance (b) is approximately 1 to 10 times the thickness (d) of the gate insulation layer (2), and the distance (a) is approximately 1 to 5 times the thickness (d) of the gate insulation layer (2) and where the ratio of b:a is approximately equal to 1:1 to 10:1, the source zone (4) and the zone (9) are of opposite conductivity types and the degree of doping of the zone (9) is selected to be such that with the maximum provided electrical operating voltage between the drain electrode (6) and the source zone (4), the majority charge carriers of the zone (9) are not depleted.

2. A field effect transistor as claimed in claim 1, wherein said source region (4,) and said conductive zone (9,) are formed as rotation-symmetrical arrangements and said zone (9,) lies between said drain region (6) and said source region (4,).

3. A field effect transistor as claimed in claim 1, wherein said source region is formed as two strips (4, 14) electrically connected together and with said gate arrangement (2,) between said two strips (4, 14).

4. A field effect transistor as claimed in claim 1, wherein said source region (4) and said drain region (62) are formed in the same surface of said semiconductor body (61).

5. A field effect transistor as claimed in claim 1, wherein the area of said source region (71) is less than the area of said gate arrangement (2,) and the area of said zone (79) is greater than the area of said source region (71) and less than the area of said gate arrangement (2,) and said source region (71) lies between the gate arrangement (2,) and the zone (79).

6. A field effect transistor with a MIS gate arrangement and with a source and drain regions in a semiconductor body, an electrically conductive zone additional provided which lies in said semiconductor body beneath the source zone and which has an electrical conductivity higher than a portion of a semiconductor body surrounding it, wherein in the region of te controllable field effect by said gate arrangement (2) said additional zone (9) is spaced a distance (a) from said gate arrangement and from the boundary surface between the semiconductor body (1) and the gate insulation layer (2), and is bounded by an edge which forms a channel having a width "c" in said zone (9) and which projects laterally by a distance (b) beyond the edge of the source zone (4) into the path of charge carriers and where the distance (b) is approximately 1 to 10 times the thickness (d) of the gate insulation layer (2), and the distance (a) is approximately 1 to 5 times the thickness (d) of the gate insulation layer (2) and where the ration of b:a is approximately equal to 1:1 to 10:1, the source zone (4) and the zone (9) are of opposite conductivity types and the degree of doping of the zone (9) is selected to be such that with the maximum provided electrical operating voltage between the drain electrode (6) and the source zone (4), the majority charge carriers of the zone (9) are not depleted.

7. A field effect transistor as claimed in claim 6, wherein said source region (4) and said conductive zone (9) are formed as rotation-symmetrical arrangements and said zone (9) lies between said drain region (6) and said source region (4).

8. A field effect transistor as claimed in claim 6 wherein said source region is formed as two strips (4, 14) electrically connected together and with said gate arrangement (2) between said two strips (4, 14).

9. A field effect transistor as claimed in claim 6 wherein said source region (4) and said drain region (62) are formed in the same surface of said semiconductor body (61).

10. A field effect transistor as claimed in claim 6 wherein the area of said source region (71) is less than the area of said gate arrangement (2) and the area of said zone (79) is greater than the area of said source region (71) and less than the area of said gate arrangement (2) and said source region (71) lies between the gate arrangement (2) and the zone (79).

* * * * *